United States Patent
McClure et al.

(10) Patent No.: US 7,440,255 B2
(45) Date of Patent: Oct. 21, 2008

(54) CAPACITOR CONSTRUCTIONS AND METHODS OF FORMING

(75) Inventors: Brent A. McClure, Meridian, ID (US); Casey R. Kurth, Eagle, ID (US); Shenlin Chen, Boise, ID (US); Debra K. Gould, Nampa, ID (US); Lyle D. Breiner, Meridian, ID (US); Er-Xuan Ping, Meridian, ID (US); Fred D. Fishburn, Boise, ID (US); Hongmei Wang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/624,340

(22) Filed: Jul. 21, 2003

(65) Prior Publication Data

US 2005/0018381 A1  Jan. 27, 2005

(51) Int. Cl.
    *H01G 4/005* (2006.01)
(52) U.S. Cl. .............. 361/303; 361/302; 361/321.1; 361/321.2; 361/311; 361/313; 438/295; 438/296
(58) Field of Classification Search .............. 361/306.1, 361/306.2, 306.3, 302–305, 321.1–5, 311–313, 361/321.2; 438/240, 248, 295–296
    See application file for complete search history.

(56) References Cited

U.S. PATENT DOCUMENTS

| | | | |
|---|---|---|---|
| 5,006,956 A | 4/1991 | Kawakita et al. | |
| 5,126,283 A | 6/1992 | Pintchovski et al. | |
| 5,187,637 A | * | 2/1993 | Embree ............ 361/313 |
| 5,316,982 A | 5/1994 | Taniguchi | |
| 5,432,732 A | 7/1995 | Ohmi | |
| 5,444,013 A | 8/1995 | Akram et al. | |
| 5,452,178 A | 9/1995 | Emesh et al. | |
| 5,625,233 A | 4/1997 | Cabral, Jr. et al. | |

(Continued)

FOREIGN PATENT DOCUMENTS

EP   1 508 906 A2   2/2005

(Continued)

OTHER PUBLICATIONS

Ritala et al, "Perfectly Conformal TiN and Al2O3 Films Deposited by Atomic Layer Deposition," Chemical Vapor Deposition, v. 5, No. 1, 1999, p. 7-9.

(Continued)

*Primary Examiner*—Nguyen T Ha
(74) *Attorney, Agent, or Firm*—Wells St. John P.S.

(57) ABSTRACT

A capacitor construction includes a first electrode and a layer between the first electrode and a surface supporting the capacitor construction. The capacitor construction can exhibit a lower RC time constant compared to an otherwise identical capacitor construction lacking the layer. Alternatively, or additionally, the first electrode may contain Si and the layer may limit the Si from contributing to formation of metal silicide material between the first electrode and the supporting surface. The layer may be a nitride layer and may be conductive or insulative. When conductive, the layer may exhibit a first conductivity greater than a second conductivity of the first electrode. The capacitor construction may be used in memory devices.

56 Claims, 6 Drawing Sheets

U.S. PATENT DOCUMENTS

| | | | |
|---|---|---|---|
| 5,641,984 | A | 6/1997 | Aftergut et al. |
| 5,774,327 | A * | 6/1998 | Park .................... 361/321.5 |
| 5,811,344 | A | 9/1998 | Tu et al. |
| 5,885,882 | A | 3/1999 | Schugraf et al. |
| 5,899,725 | A | 5/1999 | Harshfield |
| 5,905,280 | A | 5/1999 | Liu et al. |
| 5,908,947 | A | 6/1999 | Vaartstra |
| 5,972,769 | A | 10/1999 | Tsu et al. |
| 6,033,967 | A | 3/2000 | Li et al. |
| 6,069,053 | A | 5/2000 | Ping et al. |
| 6,097,052 | A | 8/2000 | Tanaka et al. |
| 6,104,049 | A | 8/2000 | Solayappan |
| 6,124,158 | A | 9/2000 | Dautartas et al. |
| 6,144,060 | A | 11/2000 | Park |
| 6,156,606 | A | 12/2000 | Michaelis |
| 6,174,770 | B1 | 1/2001 | Chi |
| 6,180,447 | B1 | 1/2001 | Park |
| 6,180,481 | B1 | 1/2001 | DeBoer et al. |
| 6,204,070 | B1 | 3/2001 | Kim |
| 6,204,172 | B1 | 3/2001 | Marsh |
| 6,207,487 | B1 | 3/2001 | Kim et al. |
| 6,207,561 | B1 | 3/2001 | Hwang et al. |
| 6,218,256 | B1 | 4/2001 | Agarwal |
| 6,218,260 | B1 | 4/2001 | Lee et al. |
| 6,222,722 | B1 | 4/2001 | Fukuzumi et al. |
| 6,242,299 | B1 | 6/2001 | Hickert |
| 6,249,056 | B1 | 6/2001 | Kwon |
| 6,262,469 | B1 * | 7/2001 | Le et al. .................... 257/532 |
| 6,270,572 | B1 | 8/2001 | Kim et al. |
| 6,274,428 | B1 | 8/2001 | Wu |
| 6,281,142 | B1 | 8/2001 | Basceri et al. |
| 6,281,543 | B1 | 8/2001 | Al-Shareef et al. |
| 6,291,289 | B2 | 9/2001 | Rhodes |
| 6,291,850 | B1 | 9/2001 | Choi et al. |
| 6,307,730 | B1 | 10/2001 | Yamanishi |
| 6,309,923 | B1 | 10/2001 | Tseng |
| 6,335,240 | B1 | 1/2002 | Kim et al. |
| 6,355,519 | B1 | 3/2002 | Lee |
| 6,359,295 | B2 | 3/2002 | Yang et al. |
| 6,363,691 | B1 * | 4/2002 | Flaherty .................... 53/412 |
| 6,391,803 | B1 | 5/2002 | Kim et al. |
| 6,403,156 | B2 | 6/2002 | Jang |
| 6,420,230 | B1 | 7/2002 | Derderian |
| 6,451,650 | B1 | 9/2002 | Lou |
| 6,458,416 | B1 | 10/2002 | Derderian et al. |
| 6,551,399 | B1 | 4/2003 | Sneh et al. |
| 6,583,441 | B2 * | 6/2003 | Moradi et al. .................. 257/68 |
| 6,596,583 | B2 | 7/2003 | Agarwal et al. |
| 6,596,602 | B2 | 7/2003 | Lizuka et al. |
| 6,627,462 | B1 | 9/2003 | Yang et al. |
| 6,664,186 | B1 | 12/2003 | Callegari et al. |
| 6,709,919 | B2 | 3/2004 | Tu |
| 6,730,163 | B2 | 5/2004 | Vaartstra |
| 6,746,930 | B2 | 6/2004 | Yang |
| 6,780,704 | B1 | 8/2004 | Raaijmakers |
| 6,800,892 | B2 * | 10/2004 | Bhattacharyya ............. 257/309 |
| 6,809,212 | B2 | 10/2004 | Meiere et al. |
| 6,824,816 | B2 | 11/2004 | Aaltonen et al. |
| 6,849,505 | B2 | 2/2005 | Lee et al. |
| 6,881,260 | B2 | 4/2005 | Marsh et al. |
| 6,946,342 | B2 | 9/2005 | Yeo et al. |
| 7,018,469 | B2 | 3/2006 | Li et al. |
| 2001/0023110 | A1 | 9/2001 | Fukuzumi et al. |
| 2001/0024387 | A1 | 9/2001 | Raaijmakers et al. |
| 2001/0038116 | A1 | 11/2001 | Figura et al. |
| 2002/0064915 | A1 | 5/2002 | Kitamura |
| 2002/0109198 | A1 | 8/2002 | Yang et al. |
| 2002/0142488 | A1 | 10/2002 | Hong |
| 2002/0153579 | A1 | 10/2002 | Yamamoto |
| 2002/0175329 | A1 | 11/2002 | Hirano |
| 2002/0182820 | A1 | 12/2002 | Choi et al. |
| 2002/0197744 | A1 | 12/2002 | Lee |
| 2003/0215960 | A1 * | 11/2003 | Mitsuhashi .................... 438/3 |
| 2004/0018747 | A1 | 1/2004 | Lee et al. |
| 2004/0125541 | A1 | 7/2004 | Chung |
| 2005/0082593 | A1 | 4/2005 | Lee et al. |

FOREIGN PATENT DOCUMENTS

| | | |
|---|---|---|
| JP | 2002/222934 A | 8/2002 |
| KR | 2002002157 A | 1/2002 |
| KR | 2002046433 | 5/2003 |

OTHER PUBLICATIONS

U.S. Appl. No. 09/653,156, Agarwal (as amended Dec. 2004).
A.W. Ott, et al., "Atomic layer controlled deposition of $Al_2O_3$ films using binary reaction sequence chemistry" Applied Surface Science (107) 1996, pp. 128-136.
U.S. Appl. No. 09/653,156, Agarwal (as filed and amended).
U.S. Appl. No. 09/653,149 Derderian (as filed and amended).

* cited by examiner

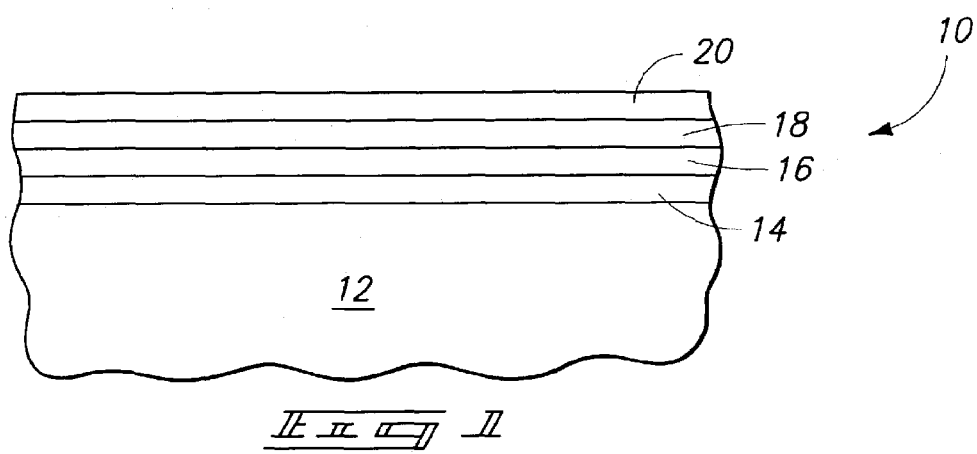
_Fig. 1_
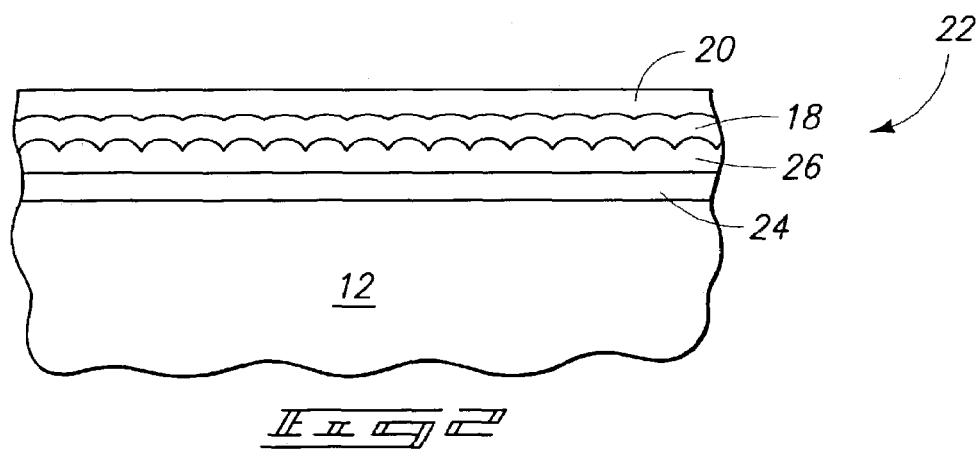
_Fig. 2_
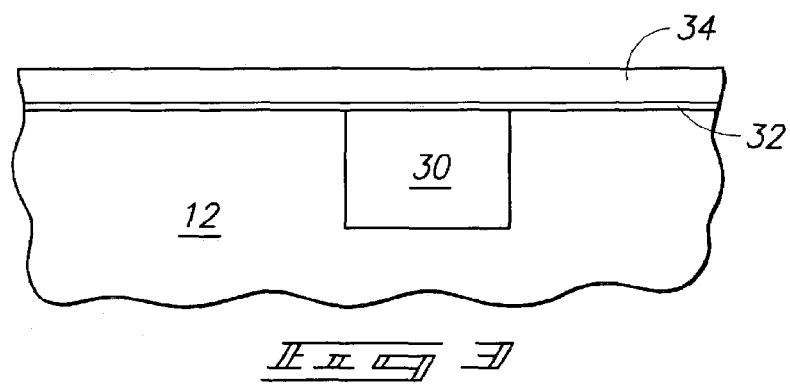
_Fig. 3_

CAPACITOR CONSTRUCTIONS AND METHODS OF FORMING

TECHNICAL FIELD

The invention pertains to capacitor constructions and methods of forming capacitor constructions. The invention also pertains to memory devices including such capacitor constructions and to computer systems including such memory devices.

BACKGROUND OF THE INVENTION

The RC (resistance and capacitance) time constant of a capacitor is indicative of the time it takes to charge or discharge the capacitor. For a given resistance, increasing capacitance will accordingly increase charging/discharging time. However, high cell capacitance becomes more desirable as devices become smaller. The increased RC time constant of high cell capacitance parts may prevent such parts from passing write time sensitive tests, resulting in decreased process margin. Also, tests designed to guardband write speed to the capacitor are limited when high cell capacitance parts are used.

As may be appreciated, improved capacitor constructions and methods of forming them are desired to decrease the RC time constant.

SUMMARY OF THE INVENTION

According to one aspect of the invention, a capacitor construction includes a first electrode, a nitride layer between the first electrode and a surface supporting the capacitor construction, a capacitor dielectric over the first electrode, and a second electrode over the capacitor dielectric. By way of example, the nitride layer may be conductive. The first electrode may be in conductive contact with the nitride layer. Accordingly, the capacitor construction may exhibit a lower RC time constant compared to an otherwise identical capacitor construction lacking the conductive nitride layer. Instead, the nitride layer may be insulative. Either way, the first electrode may contain Si and the nitride layer may limit the Si from contributing to formation of metal silicide material between the first electrode and the supporting surface. Alternatively, the capacitor construction may further include an undoped rough silicon layer between the first electrode and the nitride layer. The nitride layer may limit Si of the rough silicon layer from contributing to formation of metal silicide material between the rough silicon layer and the supporting surface. Exemplary materials for the nitride layer include TiN and silicon nitride, as well as other materials in keeping with the principles of the inventions described herein. The silicon nitride may contain $Si_3N_4$.

According to another aspect of the invention, a capacitor construction includes a storage node in a substrate, a composite first electrode, a capacitor dielectric over the first electrode, and a second electrode over the capacitor dielectric. The first electrode includes a first conductive layer over and in conductive contact with the storage node and includes a conductive polysilicon layer over and in conductive contact with the first conductive layer. The first conductive layer exhibits a first conductivity greater than a second conductivity of the polysilicon layer. By way of example, the first conductive layer may contain a nitride. The capacitor construction may exhibit a lower RC time constant compared to an otherwise identical capacitor construction lacking the first conductive layer. The first conductive layer may limit Si of the polysilicon layer from contributing to formation of metal silicide material between the polysilicon layer and the storage node.

According to a further aspect of the invention, a capacitor construction may include a metal-containing storage node in a substrate, a barrier layer over the substrate, and a polysilicon layer over the barrier layer, the polysilicon layer not physically contacting the storage node. The capacitor construction includes an opening through the polysilicon layer and barrier layer to the storage node, and a first conductive layer over the polysilicon layer and in conductive contact with the storage node through the opening. The first conductive layer is comprised by a first electrode. A capacitor dielectric is over the first electrode and a second electrode is over the capacitor dielectric. By way of example, the barrier layer may include a nitride. The barrier layer may be insulative. The barrier layer may limit Si of the polysilicon layer from contributing to formation of metal silicide material between the polysilicon layer and the metal-containing storage node.

Still further aspects of the invention include methods for forming the capacitor constructions described herein. Also, included among aspects of the invention are memory devices having a plurality of memory cells that contain the capacitor constructions described herein. Such memory devices may be part of a computer system that also includes a microprocessor. The memory devices may be dynamic random access memory (DRAM).

BRIEF DESCRIPTION OF THE DRAWINGS

Preferred embodiments of the invention are described below with reference to the following accompanying drawings.

FIG. 1 is a partial sectional view of a capacitor construction formed on a substrate according one aspect of the invention.

FIG. 2 is a partial sectional view of a capacitor construction formed on a substrate according to another aspect of the invention.

FIGS. 3-6 are partial sectional views at sequential process stages leading to formation of the capacitor construction of FIG. 6 formed on a substrate according to a further aspect of the invention.

DETAILED DESCRIPTION OF THE PREFERRED EMBODIMENTS

Figure 4:
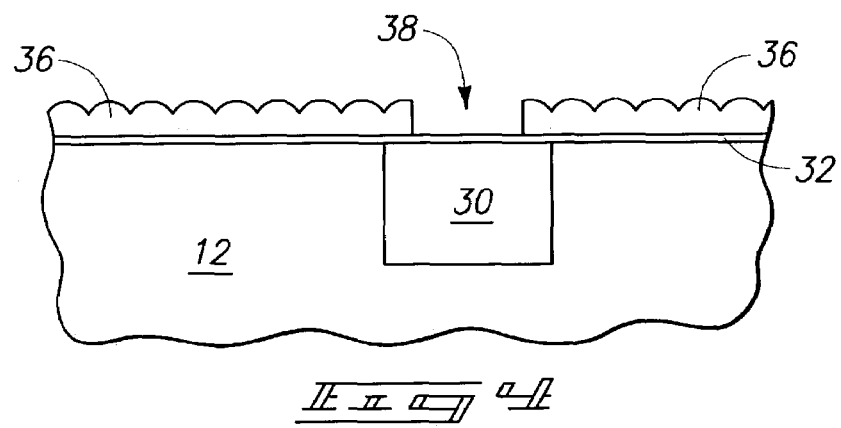

A storage node is typically electrically connected to the lower electrode of a capacitor. Exemplary storage nodes include a conductive polysilicon plug, a tungsten plug, and other structures and materials known to those skilled in the art. However, often the electrical connection between the storage node and lower electrode does not provide an equidistant path to all points within the lower electrode. Accordingly, the resistance of the lower electrode along the various conductive paths might not be uniform across the capacitor. The conductive path length within the lower electrode multiplied by the resistivity of the lower electrode yields increasing resistance for points of increasing distance from the storage node.

The net effect of the varying resistance can be modeled as several smaller sub-capacitors in parallel. The resistance of the modeled sub-capacitors' lower electrodes increases as the distance from the storage node increases. The sub-capacitors with a higher resistance in the lower electrode increase the RC time constant and the charge or discharge time for the overall combination of sub-capacitors (the actual capacitor). Reducing the electrode resistance is thus useful in reducing the RC time constant of high cell capacitance parts and allowing such parts to pass write time sensitive tests, resulting in improved process margin.

In addition, one of the conventional structures used to provide increased capacitance involves forming the capacitor dielectric on a lower electrode having a rough surface, enhancing surface area per unit area. Hemispherical grain (HSG) silicon is a common candidate for materials providing the desired rough surface. However, in the present context, a surface may be considered rough even though it comprises grains that are not considered hemispherical. Typically, smooth polysilicon is first deposited and then converted to rough silicon. Unfortunately, Si of the smooth polysilicon or rough silicon can react with the material of the storage node, especially tungsten, to create undesirable layers between the rough silicon and storage node. Such unwanted layers may include, for example, a metal silicide such as tungsten silicide. Accordingly, limiting the formation of performance degrading layers between the storage node and lower electrode is also useful.

It has been discovered that the problems described above of high RC time constant and/or undesirable material forming between the lower electrode and storage node can be resolved by forming a properly selected material under the lower electrode. Such a solution as described herein in the context of various aspects of the invention is particularly suitable where a capacitor construction is formed over a semiconductive substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. However, the aspects of the invention might also be suitable in other contexts.

In the context of the present document, the term "capacitor construction" refers to a structure suitable for comprising part or all of a completed capacitor. The most basic components of a completed capacitor include two electrodes separated by a dielectric. A capacitor construction may include one or more of the basic components. Those of ordinary skill will recognize that a completed capacitor may include additional components to form a functioning device. The capacitor constructions described herein may be considered completed capacitors or may be combined with any other components known to those of ordinary skill that may be useful in forming a functioning completed capacitor.

FIG. 1 shows a sectional view of a capacitor construction 10 formed on substrate 12. Substrate 12 provides a supporting surface for capacitor construction 10 and may be a semiconductive substrate. Substrate 12 may include a storage node (not shown) of any structure and material known to those of ordinary skill. The storage node may be formed in an insulative material, such as silicon dioxide containing material. One example includes borophosphosilicate glass (BPSG). FIG. 1 also shows an underlayer 14 on substrate 12, a first electrode 16 on underlayer 14, a dielectric 18 on first electrode 16, and a second electrode 20 on dielectric 18. The structure and composition of underlayer 14 may be selected to afford the advantages described herein after considering the structure and materials of substrate 12, a storage node, and first electrode 16 as well as potentially other considerations. For example, underlayer 14 may be conductive or insulative. Underlayer 14 may have a thickness of from about 50 to about 250 Angstroms. When insulative, underlayer 14 preferably has a thickness of from about 100 to about 200 Angstroms. When conductive, an underlayer 14 thickness can largely depend on the particular configuration of the capacitor. A thicker underlayer 14 might prompt a less thick first electrode 16 and thus decrease capacitance. A conductive underlayer 14 might be selected to address the problem of high RC time constant as well as the problem of undesired material forming under first electrode 16, such as between first electrode 16 and a storage node. An insulative underlayer 14 may be selected to resolve the problem of undesired material forming under first electrode 16.

According to one aspect of the invention, a capacitor construction includes a first electrode, a nitride layer between the first electrode and a surface supporting the capacitor construction, a capacitor dielectric over the first electrode, and a second electrode over the capacitor dielectric. The nitride layer may be conductive or insulative. The first electrode may be in conductive contact with or formed on the nitride layer. Additionally, the capacitor construction may exhibit a lower RC time constant compared to an otherwise identical capacitor construction lacking a conductive nitride layer. For example, the nitride layer may exhibit a first resistance less than a second resistance of the first electrode. The nitride layer may thus reduce the effective resistance of the lower electrode by about 25% to 35% or more.

A capacitor construction lacking the conductive nitride layer exhibits a RC time constant reflective of the resistance that occurs along conductive paths to points that are not equidistant from a storage node or other conductive connection to the first electrode. The conductive nitride layer can provide conductive pathways to such non-equidistant points at least a portion of which exhibit a lower resistance. The lower resistance thus provides a lower RC time constant and decreases the time for the capacitor construction to charge or discharge.

The nitride layer may comprise a variety of materials, including TiN, TiSiN, silicon nitride, TaN, TaSiN, and WN. Usually, TiN provides a conductive nitride layer and silicon nitride provides an insulative nitride layer. TiN and/or TaN may be preferred for conductive nitrides. When the first electrode comprises TiN or other metal-containing conductive material, it may be referred to as a metallized electrode. Regardless of nitride layer conductivity, the first electrode may include Si and the nitride layer can limit the Si from contributing to formation of metal silicide material between the first electrode and the supporting surface. One example of the first electrode including Si is a first electrode that is a conductive rough silicon layer. The rough silicon may comprise HSG. Combo HSG (CHSG) is one particularly suitable type of HSG silicon layer. CHSG formation involves a single deposition of smooth polysilicon having an outermost region that is doped for seed formation while an innermost region is not doped for seed formation (i.e., lower dopant concentration). In situ heat processing, such as annealing, can yield a seed layer that may be further heat processed to produce HSG silicon. CHSG formation may be contrasted with conventional methods that involve depositing undoped smooth polysilicon, cleaning the undoped layer, depositing doped smooth polysilicon, and heat processing to form HSG silicon.

In the case where the nitride layer is conductive, the first electrode may include the conductive rough silicon and the nitride layer. In the case where the nitride layer is insulative, a preferred first electrode further includes another conductive layer over the conductive rough silicon layer. The another conductive layer may be used in the case where the nitride layer is conductive, but it is less preferable. The another conductive layer can include TiN, as well as other materials.

FIG. 2 shows a partial sectional view of a capacitor construction 22 formed on substrate 12. Capacitor construction 22 includes a conductive layer 24 formed on substrate 12, a HSG silicon layer 26 formed on conductive layer 24, dielectric 18 formed on HSG silicon layer 26, and second electrode 20 formed on dielectric 18. An HSG silicon layer such as layer 26 may have a thickness of from about 300 to about 1000 Angstroms and may provide enhance surface area by a factor of from about 1.25 to about 2.2, preferably from about 1.5 to about 1.8, or alternatively about 2.

Attempts to improve the RC time constant of a capacitor have included forming a conductive layer similar to conductive layer 24, but between HSG silicon layer 26 and dielectric 18. One problem with such an approach includes the difficulty encountered with integrating such an intermediate conductive layer with existing processes for thereafter completing formation of the capacitor. As one example, forming dielectric 18 often involves wet gate processing of a cell nitride, such as in an oxide-nitride-oxide (ONO) composite dielectric, to reduce porosity of the nitride. However, wet gate processing may oxidize an underlying conductive layer between HSG silicon layer 26 and dielectric 18. With conductive layer 24 formed beneath HSG silicon layer 26 as in FIG. 2, such integration problems are largely resolved. Some advantage may exist to forming a conductive layer instead between HSG silicon layer 26 and dielectric 18 since it may alleviate depletion effects within HSG silicon layer 26, but resolving the integration problems is viewed as more significant.

"Depletion effects" refers to the well known phenomenon wherein charge carriers within conductive silicon migrate to the dielectric interface and deplete inner portions of the conductive silicon of the charge carriers. Since silicon is intrinsically semiconductive and is rendered conductive by addition of charge carriers, significant migration potentially creates an inner semiconductive, or even poorly semiconductive, region that in essence functions as a sort of internal dielectric. Accordingly, depletion effects can degrade capacitor performance. Conceivably, a conductive layer could be formed both below HSG silicon layer 26 and between HSG silicon layer 26 and dielectric 18. However, even though such structure may address depletion effects, it may introduce process integration problems and is thus less preferred, as indicated above. It is an advantage of aspects of the invention described herein that a conductive layer below HSG silicon layer 26 can enhance RC time constant without prompting a change in conventional process flows for dielectric 18 and later formed structures.

Notably, a capacitor construction without rough silicon as the first electrode may nevertheless include an undoped rough silicon layer between the first electrode and the nitride layer. In the present context, "undoped" silicon refers to a material having a concentration of conductivity enhancing impurities less than about $10^{20}$ atoms/centimeter$^3$ or, alternatively, less than about $10^{12}$ atoms/centimeter$^3$. This is because the processes of forming rough silicon may include introducing phosphorous or other dopants on the surface of polysilicon to provide "seeds" for growing grains. The doping may be sufficient to produce the structural change of roughening the silicon without producing a significant electrical change of increasing conductivity by 5% or more. Accordingly, roughened silicon may be considered undoped even though it actually contains dopants in the concentration ranges described above.

One purpose for providing the undoped rough silicon layer is to provide area enhancement of a thin electrode formed on the rough surface of the undoped rough silicon layer. Such an electrode may have a thickness of from about 20 to about 500 Angstroms, preferably from about 100 to about 200 Angstroms, or more preferably about 100 Angstroms. TiN is a suitable thin electrode material, as well as other metal-containing conductive materials, that may thus be used to provide an area enhanced, metal-insulator-metal (MIM) capacitor. MIM capacitors have become particularly desirable in memory devices such as DRAM.

A layer consisting of undoped rough silicon without enough other constituents sufficient to impart conductivity is typically considered semiconductive. As semiconductive material, the undoped rough silicon layer does not form part of the first electrode. However, the nitride layer may still function to limit Si of the undoped rough silicon layer from contributing to formation of metal silicide material between the rough silicon layer and the supporting surface.

According to another aspect of the invention, a capacitor construction includes a rough silicon layer, a nitride layer under the rough silicon layer, a capacitor dielectric over the rough silicon layer, and an electrode over the capacitor dielectric. FIG. 2 provides one example of such a capacitor construction in the case where conductive layer 24 is a nitride layer. When the rough silicon layer and nitride layer are conductive, the nitride layer and the rough silicon layer may form another electrode under the capacitor dielectric. Thus, the capacitor construction may exhibit a lower RC time constant compared to an otherwise identical capacitor construction lacking the conductive nitride layer. Whether conductive or insulative, the nitride layer may limit Si of the rough silicon layer from contributing to formation of metal silicide material under the rough silicon layer.

In a further aspect of the invention, a capacitor construction includes a conductive rough silicon layer over a support surface and a nitride layer between the rough silicon layer and the support surface. The capacitor construction includes a first electrode containing the rough silicon layer, a capacitor dielectric over the first electrode, and a second electrode over the capacitor dielectric. FIG. 2 shows one example of such a capacitor construction for the case where conductive layer 24 is a nitride layer and HSG silicon layer 26 is conductive.

FIGS. 1 and 2 provide simplified examples of capacitor constructions incorporating the principles described herein as addressing the problems of high RC time constant and/or undesirable material forming under a lower electrode. Because FIGS. 1 and 2 are highly simplified, those of ordinary skill will readily recognize that capacitor construction 10 and capacitor construction 22 can be readily incorporated into a variety of capacitor designs known in the art by modifying such designs in keeping with the aspects of the invention described herein. FIGS. 3-6 and FIGS. 7-12 show partial sectional views at sequential process stages used in forming the respective capacitor constructions of FIG. 6 and FIG. 12 revealing additional structural details of possible capacitor constructions.

For example, in one aspect of the invention, a capacitor construction includes a storage node in a substrate, a composite first electrode, a capacitor dielectric over the first electrode, and a second electrode over the capacitor dielectric. The composite first electrode includes a first conductive layer over and in conductive contact with the storage node and includes a conductive polysilicon layer over and in conductive contact with the first conductive layer. The first conductive layer exhibits a first conductivity greater than a second conductivity of the polysilicon layer.

By way of example, the first conductive layer may contain a nitride. The capacitor construction may exhibit a lower RC time constant compared to an otherwise identical capacitor construction lacking the first conductive layer. Also, the first conductive layer may limit Si of the polysilicon layer from contributing to formation of metal silicide material between the polysilicon layer and the storage node. Accordingly, preferably the first conductive layer does not substantially comprise silicon. Otherwise, a risk may exist for the first conductive layer to contribute to formation of metal silicide.

Further, the polysilicon layer may contain HSG silicon. The polysilicon layer may be on the first conductive layer, rather than other materials or layers being intermediate the polysilicon layer and first conductive layer with some sort of conductive contact therebetween. Typically, forming the polysilicon layer on the first conductive layer provides an adequate conductive contact.

In a further aspect of the invention, a capacitor construction includes a metal-containing storage node in a substrate, a barrier layer over the substrate, and a polysilicon layer over the barrier layer. The polysilicon layer does not physically contact the storage node. An opening is provided through the polysilicon layer and the barrier layer and to the storage node. A first conductive layer is over the polysilicon layer and in conductive contact with the storage node through the opening. The first conductive layer is comprised by a first electrode, a capacitor dielectric is over the electrode, and a second electrode is over the capacitor dielectric.

The barrier layer may include a nitride. The barrier layer may be insulative. The barrier layer may limit Si of the polysilicon layer and metal of the metal-containing storage node from contributing to formation of metal silicide. One example of a storage node metal includes tungsten. The barrier layer may thus limit formation of tungsten silicide. Notably, the first electrode may further include the polysilicon layer in addition to including the first conductive layer. The first conductive may be on the polysilicon layer. The polysilicon layer may instead be undoped or not otherwise comprised by the first electrode.

Figure 5:
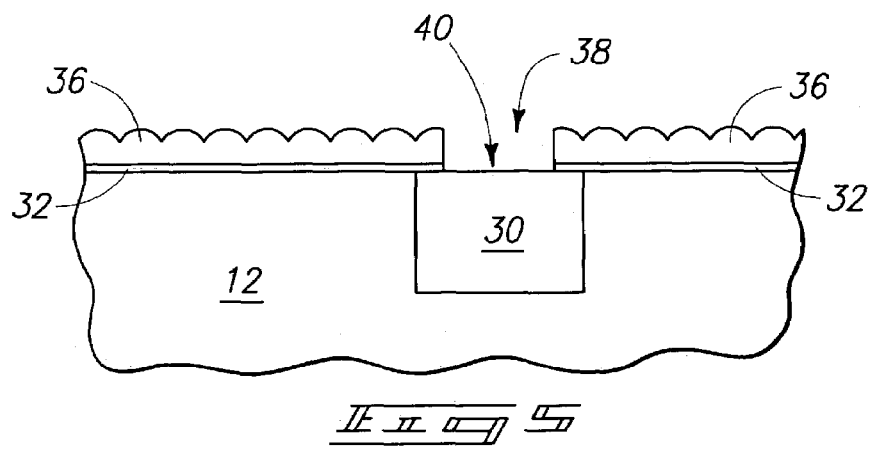
Figure 6:
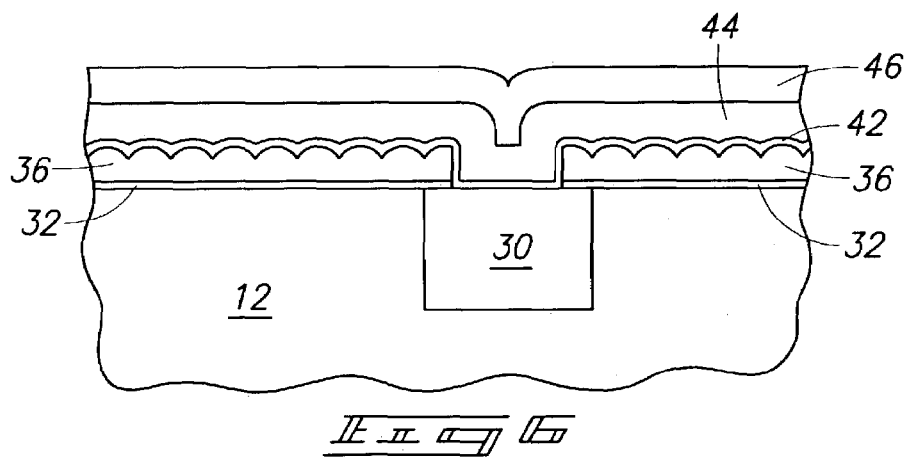

FIGS. 3-6 show sectional views at sequential process stages in forming a capacitor construction 28 of FIG. 6 that is one example of the just described aspect of the invention. FIG. 3 shows insulative layer 32 formed over substrate 12 and storage node 30 within substrate 12. Polysilicon layer 34 is formed over insulative layer 32. Insulative layer 32 may be a barrier layer. FIG. 4 shows a sectional view at a subsequent process stage after removing a portion of polysilicon layer 34 from over storage node 30 and converting remaining polysilicon layer 34 to a HSG silicon layer 36. Thus, a first opening 38 is formed through HSG silicon layer 36 to insulative layer 32. When insulative layer 32 is a barrier layer, it may limit Si of polysilicon layer 34 and HSG silicon layer 52 from contributing to formation of metal silicide material between such layers and storage node 30.

FIG. 5 shows a sectional view at a subsequent process stage after removing insulative layer 32 from over storage node 30, forming opening 40 through insulative layer 32 to storage node 30. FIG. 6 shows a sectional view at a subsequent process stage where a conductive layer 42 is formed on HSG silicon layer 36 and in conductive contact with storage node 30 through opening 38 and opening 40. A dielectric 44 is formed on conductive layer 42 and a second electrode 46 is formed on dielectric 44. In the case where HSG silicon layer 36 is conductive, conductive layer 42 and HSG silicon layer 36 together form a first electrode. In the case where HSG silicon layer 36 is undoped and otherwise not conductive, conductive layer 42 alone forms a first electrode. As may be appreciated from FIG. 6, insulative layer 32 functioning as a barrier layer may limit Si of polysilicon layer 32 and/or HSG silicon layer 36 from contributing to formation of metal silicide material between such layers and storage node 30.

Figure 7:
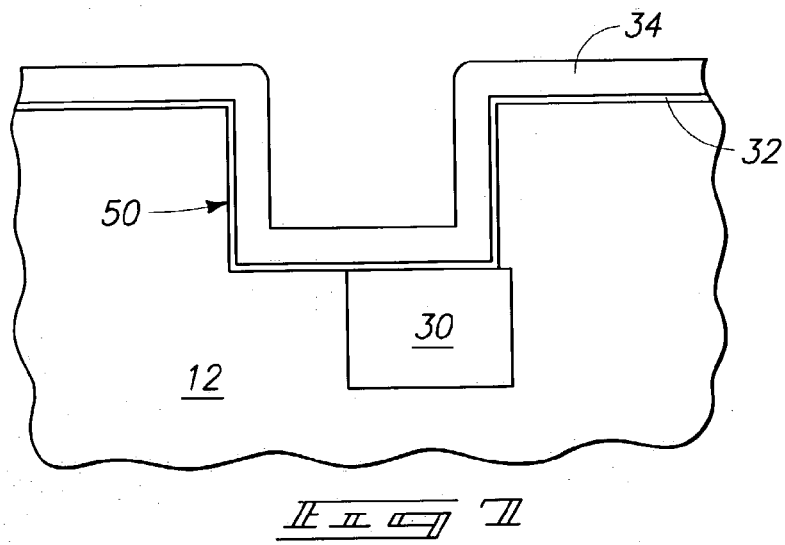
FIGS. 7-12 are partial sectional views at sequential process stages leading to formation of the capacitor construction of FIG. 12 formed on a substrate according to a still further aspect of the invention.
Figure 8:
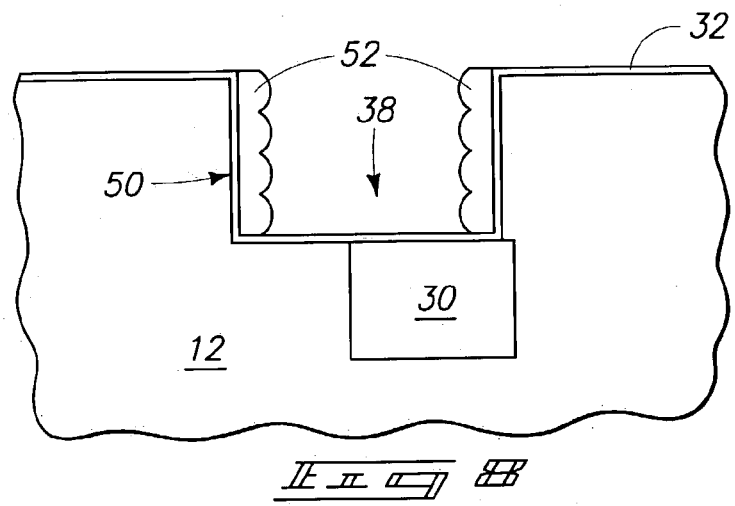
Figure 10:
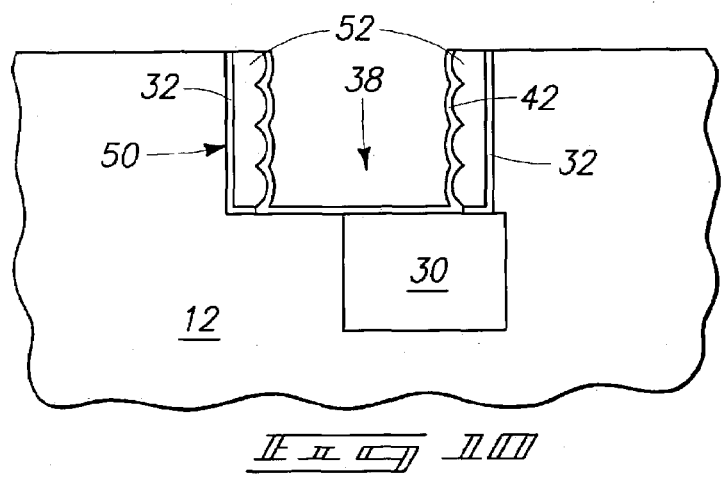
Figure 11:
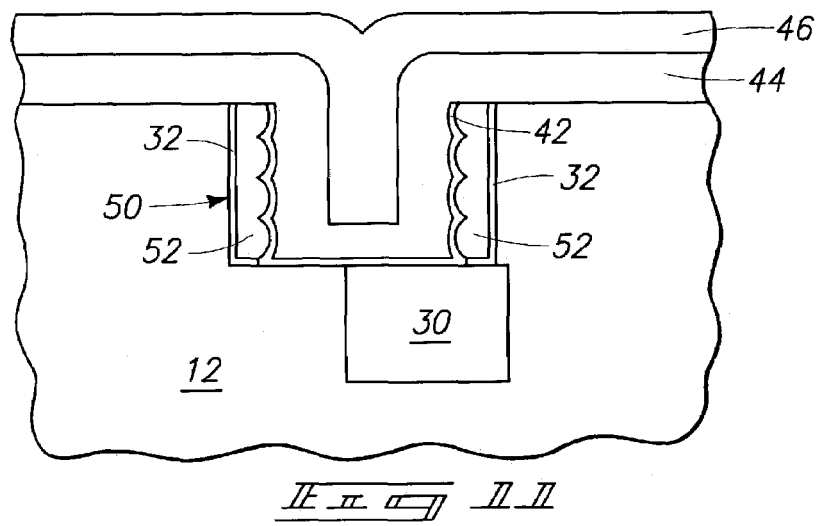
Figure 12:
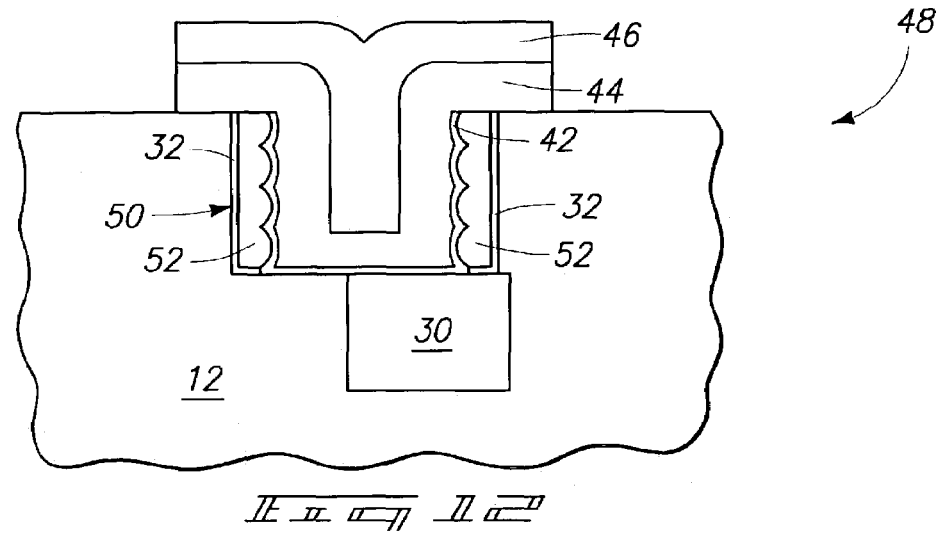

Turning to FIGS. 7-12, sectional views at sequential process stages are shown to form a capacitor construction 48 of FIG. 12. Noticeably, at least a part of capacitor construction 48 is formed within a container 50. Any size and shape of container known to those skilled in the art may be used. FIG. 7 shows insulative layer 32 formed over substrate 12 and storage node 30, including within container 50 formed as an opening within substrate 12. Polysilicon layer 34 is formed on insulative layer 32. FIG. 8 shows a subsequent sectional view after performing a spacer etch of polysilicon layer 34, such that polysilicon layer 34 remains only over sidewalls of container 50, and after converting remaining polysilicon layer 34 to HSG silicon layer 52. Opening 38 is thus formed through HSG silicon layer 52 to insulative layer 32.

The spacer etch of polysilicon layer 34 may include providing a halogen gas, a fluorine containing gas, and an inert gas while applying RF source and bias power under low pressure conditions. The halogen gas may comprise the majority of the gases. The halogen gas may be $Cl_2$ flowed at about 45 standard cubic centimeters per minute (sccm), the fluorine containing gas may be $NF_3$ flowed at about 15 sccm, and the inert gas may be He used for added uniformity. A source power of about 350 watts (W), a bias power of about 200 W, and a pressure of about 10 milliTorr are suitable.

Figure 9:
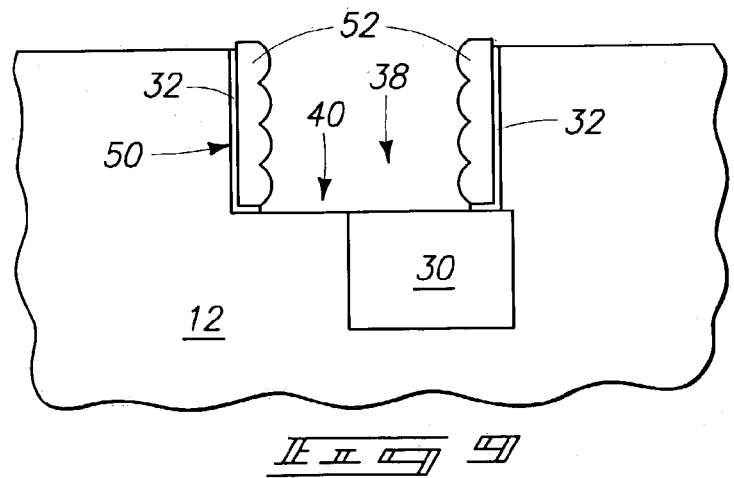

FIG. 9 shows a sectional view at a process stage subsequent to that shown in FIG. 8. After etching, insulative layer 32 is removed from over substrate 12 where exposed following the spacer etch of polysilicon layer 34. Removal of exposed insulative layer 32 may include similar conditions to those described above for the spacer etch with the substitution of a fluorinated, carbon-containing gas instead of the halogen and fluorinated gases. $CF_4$, $CHF_3$, or a combination thereof may be used.

FIG. 10 shows a sectional view at a subsequent process stage where conductive layer 42 is formed on HSG silicon layer 52 and within container 50 on exposed portions of substrate 12 and storage node 30. The structure of FIG. 10 results after formation of conductive layer 42 followed by chemical mechanical polishing to remove conductive layer 42 and HSG silicon layer 52 outside of container 50.

In FIG. 11, dielectric 44 is shown formed on conductive layer 42 and second electrode 46 is shown formed on dielectric 44. When HSG silicon layer 52 is undoped or otherwise not conductive, conductive layer 42 forms a first electrode. When HSG silicon layer 52 is conductive, both HSG silicon layer 52 and conductive layer 42 together form a first electrode. In FIG. 12, dielectric 44 and second electrode 46 are shown after etching to remove excess portions.

Figure 13:
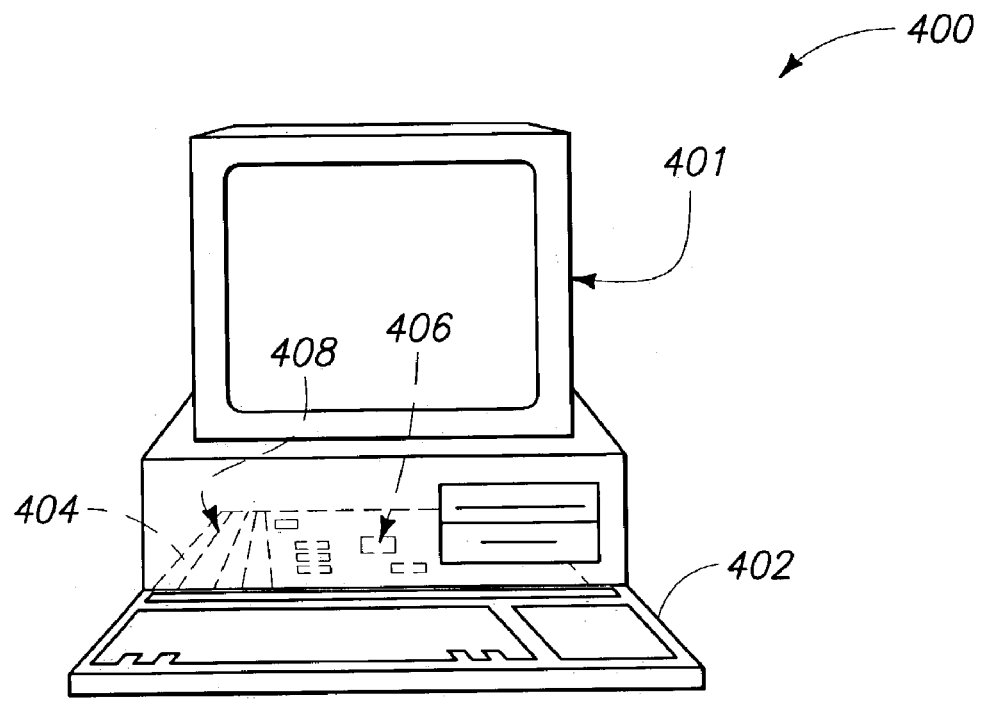
FIG. 13 is a diagrammatic view of a computer illustrating an exemplary application of the present invention.
Figure 14:
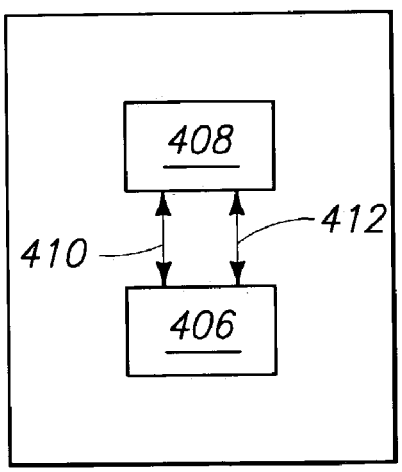
FIG. 14 is a block diagram showing particular features of the motherboard of the FIG. 14 computer.

FIG. 13 illustrates generally, by way of example, but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 14. In such block diagram, the addressing circuitry is illustrated as 410 and the read circuitry is illustrated as 412.

In particular aspects of the invention, memory device 408 can correspond to a memory module. For example, single in-line memory modules (SIMMs) and dual in-line memory modules (DIMMs) may be used in the implementation which utilize the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

Figure 15:
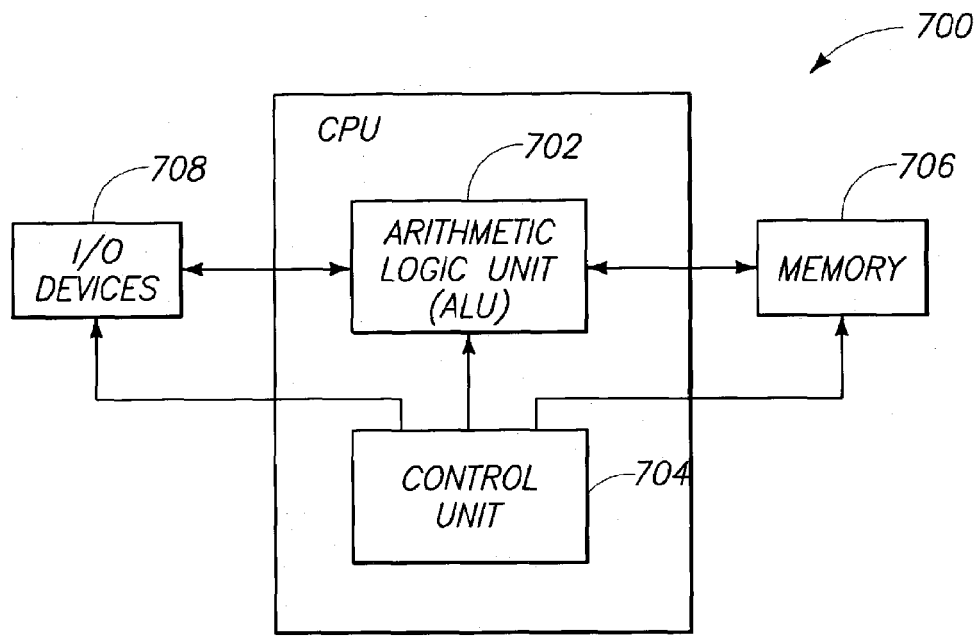
FIG. 15 is a high level block diagram of an electronic system according to an exemplary aspect of the present invention.

FIG. 15 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include DRAM cells in accordance with various aspects of the present invention.

Figure 16:
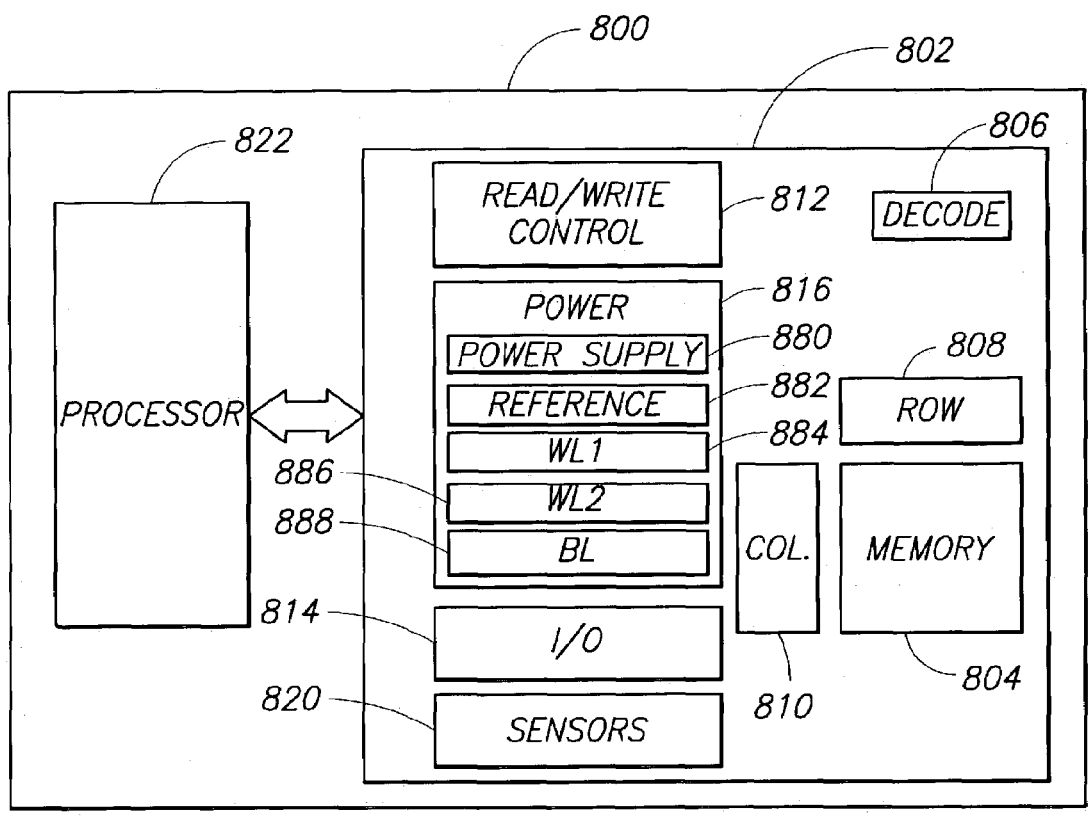
FIG. 16 is a simplified block diagram of an exemplary memory device according to an aspect of the present invention.

FIG. 16 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. The system 800 also includes a processor 822, or memory controller for memory accessing.

The memory device 802 receives control signals 824 from the processor 822 over wiring or metallization lines. The memory device 802 is used to store data which is accessed via I/O lines. It will be appreciated by those skilled in the art that additional circuitry and control signals can be provided, and that the memory device 802 has been simplified to help focus on the invention. At least one of the processor 822 or memory device 802 can include a capacitor construction in a memory device of the type described previously herein.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of the ordinary skill in the art will understand that the various electronic systems can be fabricated in single-package processing units, or even on a single semiconductor chip, in order to reduce the communication time between the processor and the memory device(s).

Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A capacitor construction comprising:
   a first electrode;
   a conductive nitride layer between the first electrode and a surface supporting the capacitor construction, the first electrode being in conductive contact with the nitride layer;
   a capacitor dielectric over the first electrode; and
   a second electrode over the capacitor dielectric, the capacitor construction exhibiting a lower RC time constant compared to an otherwise identical capacitor construction lacking the conductive nitride layer.

2. The capacitor construction of claim 1 wherein the nitride layer comprises TiN.

3. The capacitor construction of claim 1 wherein the first electrode comprises a conductive rough silicon layer.

4. The capacitor construction of claim 3 wherein the first electrode further comprises another conductive layer over the rough silicon layer.

5. The capacitor construction of claim 1 wherein the first electrode comprises Si and the nitride layer limits the Si from contributing to formation of metal silicide material between the first electrode and the supporting surface.

6. The capacitor construction of claim 1 further comprising an undoped rough silicon layer between the first electrode and the nitride layer, the nitride layer limiting Si of the rough silicon layer from contributing to formation of metal silicide material between the rough silicon layer and the supporting surface.

7. A capacitor construction comprising:
a first electrode;
a insulative nitride layer between the first electrode and a surface supporting the capacitor construction;
a capacitor dielectric over the first electrode; and
a second electrode over the capacitor dielectric.

8. The capacitor construction of claim 7 wherein the first electrode is on the nitride layer.

9. The capacitor construction of claim 7 wherein the nitride layer comprises silicon nitride.

10. A capacitor construction comprising:
a rough silicon layer;
a nitride layer under the rough silicon layer;
a capacitor dielectric over the rough silicon layer; and
an electrode over the capacitor dielectric.

11. The capacitor construction of claim 10 wherein the nitride layer is conductive.

12. The capacitor construction of claim 11 wherein the rough silicon layer is conductive, the nitride layer and the rough silicon layer being comprised by another electrode under the capacitor dielectric.

13. The capacitor construction of claim 12 exhibiting a lower RC time constant compared to an otherwise identical capacitor construction lacking the conductive nitride layer.

14. The capacitor construction of claim 10 wherein the nitride layer comprises TiN.

15. The capacitor construction of claim 10 wherein the nitride layer is insulative.

16. The capacitor construction of claim 15 wherein the rough silicon layer is on the nitride layer.

17. The capacitor construction of claim 15 further comprising another electrode over the rough silicon layer and under the capacitor dielectric.

18. The capacitor construction of claim 15 wherein the nitride layer comprises silicon nitride.

19. The capacitor construction of claim 16 wherein the rough silicon layer is undoped.

20. The capacitor construction of claim 16 wherein the nitride layer limits Si of the rough silicon layer from contributing to formation of metal silicide material under the rough silicon layer.

21. A capacitor construction comprising:
a conductive rough silicon layer over a support surface;
a nitride layer between the rough silicon layer and the support surface;
a first electrode comprising the rough silicon layer;
a capacitor dielectric over the first electrode; and
a second electrode over the capacitor dielectric.

22. The capacitor construction of claim 21 wherein the nitride layer is conductive.

23. The capacitor construction of claim 22 wherein the first electrode further comprises the nitride layer.

24. The capacitor construction of claim 23 exhibiting a lower RC time constant compared to an otherwise identical capacitor construction lacking the conductive nitride layer.

25. The capacitor construction of claim 21 wherein the nitride layer comprises TiN.

26. The capacitor construction of claim 21 wherein the nitride layer is insulative.

27. The capacitor construction of claim 26 wherein the first electrode further comprises another conductive layer between the rough silicon layer and the capacitor dielectric.

28. The capacitor construction of claim 27 wherein the another conductive layer comprises TiN.

29. The capacitor construction of claim 21 wherein the nitride layer comprises silicon nitride.

30. The capacitor construction of claim 21 wherein the nitride layer limits Si of the rough silicon layer from contributing to formation of metal suicide material between the rough silicon layer and the support surface.

31. A capacitor construction comprising:
a storage node in a substrate;
a composite first electrode comprising a first conductive layer over and in conductive contact with the storage node and comprising a conductive polysilicon layer over and in conductive contact with the first conductive layer, the first conductive layer exhibiting a first conductivity greater than a second conductivity of the polysilicon layer;
a capacitor dielectric over the first electrode; and
a second electrode over the capacitor dielectric.

32. The capacitor construction of claim 31 wherein the first conductive layer comprises a nitride.

33. The capacitor construction of claim 31 exhibiting a lower RC time constant compared to an otherwise identical capacitor construction lacking the first conductive layer.

34. The capacitor construction of claim 31 wherein the first conductive layer limits Si of the polysilicon layer from contributing to formation of metal silicide material between the polysilicon layer and the storage node.

35. The capacitor construction of claim 31 wherein the first conductive layer does not substantially comprise silicon.

36. The capacitor construction of claim 31 wherein the first conductive layer comprises TiN.

37. The capacitor construction of claim 31 wherein the polysilicon layer comprises HSG silicon.

38. The capacitor construction of claim 31 wherein the polysilicon layer is on the first conductive layer.

39. A capacitor construction forming method comprising:
forming a conductive nitride layer over a surface supporting the capacitor construction;
forming a first electrode in conductive contact with the nitride layer;
forming a capacitor dielectric over the first electrode; and
forming a second electrode over the capacitor dielectric, the capacitor construction exhibiting a lower RC time constant compared to an otherwise identical capacitor construction lacking the conductive nitride layer.

40. The method of claim 39 wherein the first electrode comprises a conductive HSG silicon layer and another conductive layer over the HSG silicon layer.

41. The method of claim 39 wherein the first electrode comprises Si and the nitride layer limits the Si from contributing to formation of metal silicide material between the first electrode and the supporting surface.

42. The method of claim 39 further comprising forming an undoped HSG silicon layer between the first electrode and the nitride layer, the nitride layer limiting Si of the HSG silicon layer from contributing to formation of metal silicide material between the HSG silicon layer and the supporting surface.

43. A capacitor construction forming method comprising:
forming an insulative nitride layer over a surface supporting the capacitor construction;
forming a first electrode over the nitride layer;
forming a capacitor dielectric over the first electrode; and
forming a second electrode over the capacitor dielectric.

44. A capacitor construction forming method comprising
forming a storage node in a substrate;
forming a first conductive layer over and in conductive contact with the storage node;
forming a conductive polysilicon layer over and in conductive contact with the first conductive layer, the first conductive layer exhibiting a first conductivity greater than a second conductivity of the polysilicon layer and the first conductive layer and polysilicon layer being comprised by a composite first electrode;
forming a capacitor dielectric over the first electrode; and
forming a second electrode over the capacitor dielectric.

45. The method of claim 44 wherein the first conductive layer comprises a nitride.

46. The method of claim 44 wherein the capacitor construction exhibits a lower RC time constant compared to an otherwise identical capacitor construction lacking the first conductive layer.

47. The method of claim 44 wherein the first conductive layer limits Si of the polysilicon layer from contributing to formation of metal silicide material between the polysilicon layer and the storage node.

48. The method of claim 44 wherein the polysilicon layer is formed on the first conductive layer.

49. A memory device comprising a plurality of memory cells that have a capacitor including:
a first electrode;
a conductive nitride layer between the first electrode and a surface supporting the capacitor construction, the first electrode being in conductive contact with the nitride layer;
a capacitor dielectric over the first electrode; and
a second electrode over the capacitor dielectric, the capacitor construction exhibiting a lower RC time constant compared to an otherwise identical capacitor construction lacking the conductive nitride layer.

50. The memory device of claim 49 wherein the plurality of memory cells comprises an array of memory cells and the memory device comprises DRAM.

51. A memory device comprising a plurality of memory cells that have a capacitor including:
a storage node in a substrate;
a composite first electrode comprising a first conductive layer over and in conductive contact with the storage node and a conductive polysilicon layer over and in conductive contact with the first conductive layer, the first conductive layer exhibiting a first conductivity greater than a second conductivity of the polysilicon layer;
a capacitor dielectric over the first electrode; and
a second electrode over the capacitor dielectric.

52. The memory device of claim 51 wherein the plurality of memory cells comprises an array of memory cells and the memory device comprises DRAM.

53. A computer system, the computer system comprising a memory device and a microprocessor, the memory device including:
a first electrode;
a conductive nitride layer between the first electrode and a surface supporting the capacitor construction, the first electrode being in conductive contact with the nitride layer;
a capacitor dielectric over the first electrode; and
a second electrode over the capacitor dielectric, the capacitor construction exhibiting a lower RC time constant compared to an otherwise identical capacitor construction lacking the conductive nitride layer.

54. The computer system of claim 53 wherein the memory device comprises DRAM.

55. A computer system, the computer system comprising a memory device and a microprocessor, the memory device including:
a storage node in a substrate;
a composite first electrode comprising a first conductive layer over and in conductive contact with the storage node and a conductive polysilicon layer over and in conductive contact with the first conductive layer, the first conductive layer exhibiting a first conductivity greater than a second conductivity of the polysilicon layer;
a capacitor dielectric over the first electrode; and
a second electrode over the capacitor dielectric.

56. The computer system of claim 55 wherein the memory device comprises DRAM.

* * * * *

UNITED STATES PATENT AND TRADEMARK OFFICE
CERTIFICATE OF CORRECTION

PATENT NO. : 7,440,255 B2  
APPLICATION NO. : 10/624340  
DATED : October 21, 2008  
INVENTOR(S) : McClure et al.

Page 1 of 1

It is certified that error appears in the above-identified patent and that said Letters Patent is hereby corrected as shown below:

In column 11, line 51, in Claim 19, delete "16" and insert -- 10 --, therefor.

In column 11, line 53, in Claim 20, delete "16" and insert -- 10 --, therefor.

In column 12, line 17, in Claim 30, delete "suicide" and insert -- silicide --, therefor.

In column 13, line 9, in Claim 44, after "comprising" insert -- : --.

Signed and Sealed this

Thirteenth Day of January, 2009

JON W. DUDAS  
*Director of the United States Patent and Trademark Office*